US007795543B2

(12) United States Patent
Krohn et al.

(10) Patent No.: US 7,795,543 B2
(45) Date of Patent: Sep. 14, 2010

(54) ELECTRICAL DEVICE

(75) Inventors: Thomas Krohn, Schwalbach (DE); Horst Ullrich, Schoeneck (DE)

(73) Assignee: Continental Automotive AG, Hannover (DE)

( * ) Notice: Subject to any disclaimer, the term of this patent is extended or adjusted under 35 U.S.C. 154(b) by 327 days.

(21) Appl. No.: 12/083,382

(22) PCT Filed: Sep. 21, 2006

(86) PCT No.: PCT/EP2006/066596

§ 371 (c)(1),
(2), (4) Date: Apr. 9, 2008

(87) PCT Pub. No.: WO2007/042383

PCT Pub. Date: Apr. 19, 2007

(65) Prior Publication Data

US 2009/0159329 A1   Jun. 25, 2009

(51) Int. Cl.
*H05K 9/00* (2006.01)
(52) U.S. Cl. .................. 174/382; 174/387; 361/816
(58) Field of Classification Search ................. 174/377, 174/382, 387; 361/752, 816, 818
See application file for complete search history.

(56) References Cited

U.S. PATENT DOCUMENTS

| 5,014,160 | A |   | 5/1991  | McCoy, Jr. |         |
|-----------|---|---|---------|------------|---------|
| 5,160,807 | A |   | 11/1992 | Fry        |         |
| 5,323,299 | A | * | 6/1994  | Weber      | 361/818 |
| 5,353,201 | A | * | 10/1994 | Maeda      | 361/816 |

(Continued)

FOREIGN PATENT DOCUMENTS

DE   40 00 286   7/1991

(Continued)

OTHER PUBLICATIONS

International Search Report and Written Report dated Jun. 15, 2007 issued in corresponding application No. PCT/EP2006/066596.

*Primary Examiner*—Hung V Ngo
(74) *Attorney, Agent, or Firm*—Cohen Pontani Lieberman & Pavane LLP

(57) ABSTRACT

The invention relates to an electrical device comprising a supporting substrate (1) which supports electronic components (2) as well as a strip conductor structure for connecting the electronic components (2) and on which an electrically conducting shielding element is disposed that surrounds the strip conductor structure and the components (2). The shielding element is composed of a first pot-type shielding part (7), the edge region of the hole of which rests upon contact areas (5) of a first surface (8) of the supporting substrate (1), said contact areas (5) being connected to a fixed electrical potential, and a second pot-type shielding part (9), the edge region of the hole of which rests upon a second surface (10) of the supporting substrate (1). The shielding parts (7 and 9) can be fastened to the supporting substrate (1) by means of fastening attachments which engage into first recesses (6) of the supporting substrate (1). The supporting substrate (1) is provided with continuous second recesses, through which protrude first spring arms (11) of the first shielding part (7) and second spring arms (12) of the second shielding part (9), the free final zones of which protrude from the second recesses and contact the second shielding part and/or the first shielding part.

19 Claims, 4 Drawing Sheets

U.S. PATENT DOCUMENTS

| | | | |
|---|---|---|---|
| 5,740,013 A * | 4/1998 | Roesner et al. | 361/697 |
| 5,745,349 A * | 4/1998 | Lemke | 361/818 |
| 5,774,344 A * | 6/1998 | Casebolt | 361/800 |
| 5,911,356 A * | 6/1999 | Tsurusaki | 228/136 |
| 6,137,689 A * | 10/2000 | Schechtel et al. | 361/759 |
| 6,191,950 B1 * | 2/2001 | Cox et al. | 361/737 |
| 6,194,655 B1 * | 2/2001 | Lange et al. | 174/377 |
| 6,195,244 B1 * | 2/2001 | Barz | 361/111 |
| 6,979,773 B2 | 12/2005 | Fürsich | |
| 6,985,366 B2 | 1/2006 | Albayrak et al. | |
| 7,085,142 B2 | 8/2006 | Berberich | |
| 2004/0256128 A1 | 12/2004 | King | |

FOREIGN PATENT DOCUMENTS

| | | |
|---|---|---|
| DE | G 93 05 711 | 7/1993 |
| DE | G 93 19 079 | 4/1994 |
| DE | 43 27 766 | 2/1995 |
| DE | 102 23 170 | 12/2003 |
| DE | 102 24 221 | 12/2003 |
| WO | WO 2004/008823 | 1/2007 |

* cited by examiner

1
ELECTRICAL DEVICE

CROSS REFERENCE TO RELATED APPLICATIONS

This is a U.S. national stage of application No. PCT/EP2006/066596, filed on 21 Sep. 2006. Priority is claimed on German Application No. 10 2005 048 416.6, filed 10 Oct. 2005, the content of which is incorporated herein by reference.

BACKGROUND OF THE INVENTION

1. Field of the Invention

The invention relates to an electrical device comprising a carrier substrate which carries electronic components and carries a conductor track structure for connecting the electronic components and on which is arranged an electrically conductive shielding element enclosing the conductor track structure and the components, wherein the shielding element comprises a first pot-like shielding part, which bears with its opening edge region on contact areas of a first surface of the carrier substrate, said contact areas being connected to a fixed electrical potential, and a second pot-like shielding part, which bears with its opening edge region on a second surface of the carrier substrate, and the shielding parts can be fixed on the carrier substrate by means of fixing attachments which engage into first cutouts of the carrier substrate.

2. Description of the Prior Art

Electronic and electrical apparatuses generate electromagnetic fields which can bring about malfunctions or failures of other electronic apparatuses.

Electronic circuits or circuit parts have to satisfy the legal EMC specifications. Even more stringent requirements often arise as a result of the area of use of the apparatus e.g. as a safety part in a motor vehicle.

In order to ensure the function of electronic circuits under the required EMC requirements, they have to be shielded with an electrically conductive metal housing. In this case, the housing must be closed as completely as possible. In order to obtain a sufficient shielding effect, the permissible maximum housing openings have to become smaller and smaller as frequencies of the electromagnetic radiation increase.

It may also be necessary to shield two or more circuit parts on the same circuit carrier from one another.

In an electrical device of the type mentioned in the introduction it is known for at least one fixing attachment to be present which can be latched into a cutout of the carrier substrate for the purpose of fixing the shielding part to the carrier substrate.

SUMMARY OF THE INVENTION

It is an object of the invention to provide an electrical device of the type mentioned in the introduction which is shielded well in particular also against high-frequency electromagnetic fields and magnetic fields.

This object is achieved according to the invention by virtue of the fact that the carrier substrate has continuous second cutouts, through which protrude first spring arms of the first shielding part and/or second spring arms of the second shielding part, which protrude with their free end regions from the second cutouts and make contact with the second shielding part and/or the first shielding part.

By virtue of the spring arms, the electronic components and the conductor track structures can be surrounded at least largely completely with metal since this is also effected in the region of the carrier substrate.

Simple mounting and demounting for inspection and repair of the electronic components are made possible at the same time.

The customary motor vehicle requirements with regard to temperature and vibration loads are also met as a result of the spring arms mutually making contact with the shielding parts.

As a result of being largely completely surrounded with metal, the electronic components and also the conductor track structure are shielded well both against high-frequency electromagnetic fields in the GHz range, such as e.g. of a mobile telephone, and against magnetic fields in the kHz range, such as e.g. of loudspeaker cables.

The shielding elements are mounted only after soldering, soldered joint inspection, repair, programming and testing of the electronic components and of the conductor track structure.

Only the two shielding parts are required for shielding. Further parts e.g. for fixing such as rivets or screws are not required, thereby simplifying stock keeping for the shielding components.

If the first spring arms of the first shielding part rest resiliently with their free end against the second shielding part and/or the second spring arms of the second shielding part rest resiliently with their free end against the first shielding part, then this simultaneously effects a direct electrical connection between the two shielding parts.

A good shielding density is effected by virtue of the fact that a plurality of first spring arms and/or a plurality of second spring arms are arranged adjacent to one another at a distance corresponding to a spring arm width, wherein the second cutouts are slots through which a plurality of first spring arms and/or second spring arms protrude adjacent to one another.

The shielding is virtually uninterrupted in the region of the spring arms if, in this case, first and second spring arms protrude through the slots alternately adjacent to one another.

Simple mounting without additional fixing elements is possible by virtue of the fact that the fixing attachments are sheet-metal arms which protrude through the first cutouts and whose free ends protruding from the first cutouts are deformable.

However, it is also possible for separate rivets, rivets composed of rim holes composed of the material of the shielding parts, bending or interlacing lug variants or lugs to be used as latching hooks instead of the sheet-metal arms.

A fixed connection between the two shielding parts and thus also a securing ring on the carrier substrate are achieved by virtue of the fact that the first shielding part and/or the second shielding part has on its peripheral opening edge lugs—bent in a manner directed away from the interior of the first shielding part into a plane parallel to the plane of the carrier substrate—having through openings which have approximately the same cross section as the sheet-metal arms and through which the free ends of the sheet-metal arms protrude and are deformable.

For the defined supporting of the shielding parts on the carrier substrate, preferably the first shielding part and/or the second shielding part has a plurality of bearing shoulders which are arranged in a manner distributed on its peripheral opening edge and are bent in a manner directed away from the interior of the first shielding part into a plane approximately parallel to the plane of the carrier substrate.

In the regions in which conductor tracks are intended to be led out from the shielded region, the first shielding part and/or the second shielding part can have on its peripheral opening edge one or a plurality of contact lugs which are bent in a manner directed away from the interior of the first and/or second shielding part into a plane approximately parallel to the plane of the carrier substrate and which can be placed resiliently against the contact area or contact areas of the carrier substrate.

In this case, the contact lugs are preferably arranged in the regions between the spring arms and/or the sheet-metal arms.

In order to enhance the metallic enclosing, the contact lugs can be arranged opposite one another on the first surface and the second surface of the carrier substrate and can be electrically conductively connected to one another by means of plated-through holes in the carrier substrate, wherein a plated-through hole can be arranged in the region of each contact lug.

In order to implement the enclosing as tightly as possible, the plated-through holes can be arranged at a small distance from one another.

The carrier substrate is preferably a multilayer printed circuit board.

In this case, one or two outer conductive levels of the multilayer printed circuit board can form the contact areas and be connected to the fixed electrical potential, and one or a plurality of inner conductive levels of the multilayer printed circuit board can be signal-carrying conductor tracks.

This makes it possible, in a simple manner, also to lead conductor tracks from inside the shielding parts toward the outside.

A plurality of conductor track structures for connecting electronic components can be arranged on the carrier substrate, wherein each conductor track structure is enclosed by an electrically conductive shielding element.

In this case, the shielding parts arranged on one side of the carrier substrate can be formed in one piece with a partition.

For electrically connecting the two conductor track structures, the latter are preferably conductively connected to one another via an inner conductive level of the multilayer printed circuit board.

BRIEF DESCRIPTION OF THE DRAWINGS

An exemplary embodiment of the invention is illustrated in the drawing and is described in more detail below. In the figures.

DETAILED DESCRIPTION OF THE PREFERRED EMBODIMENTS

Figure 1:
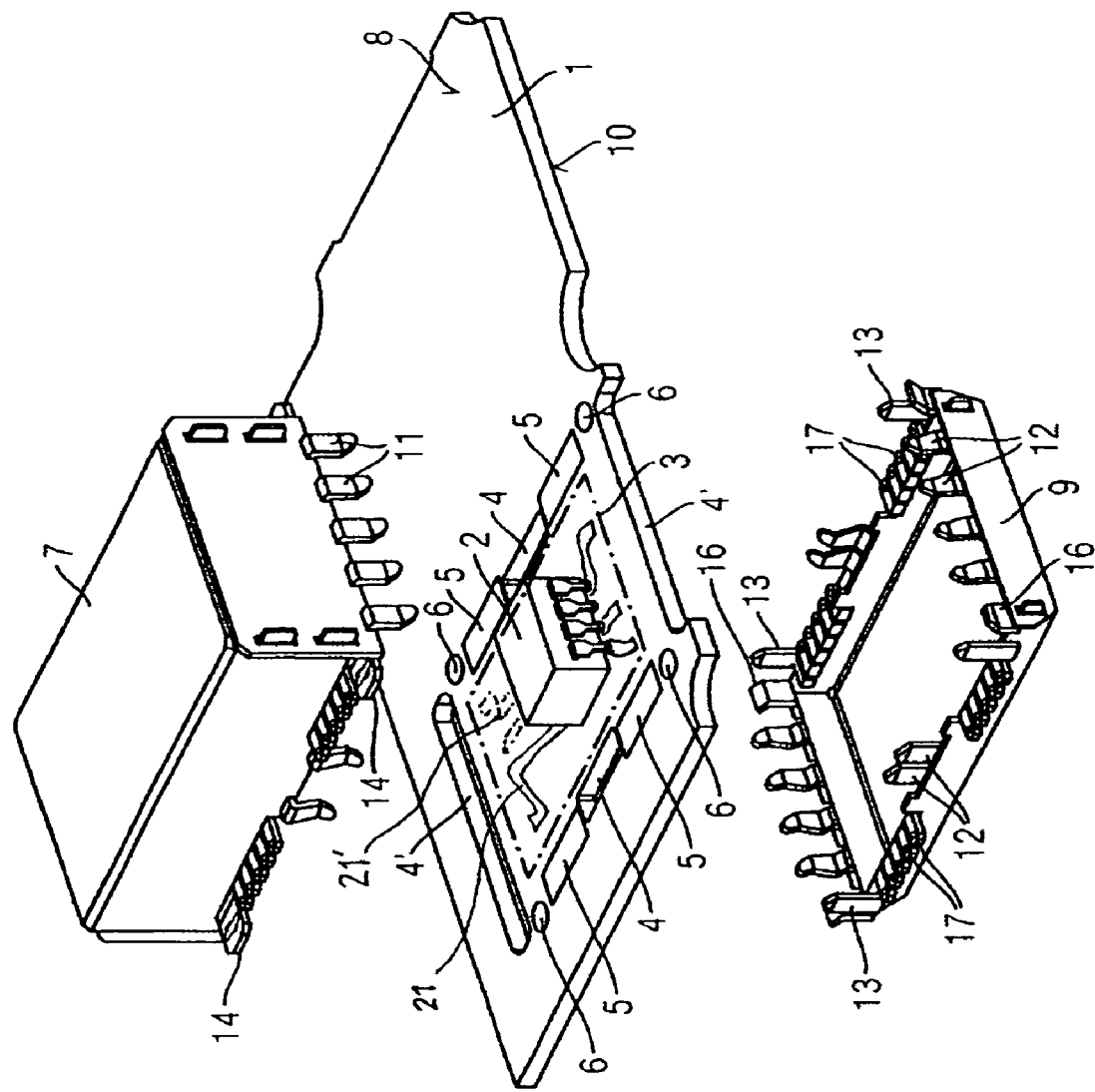
FIG. 1 shows an electrical device in a perspective exploded illustration according to an embodiment of the present invention.
Figure 2:
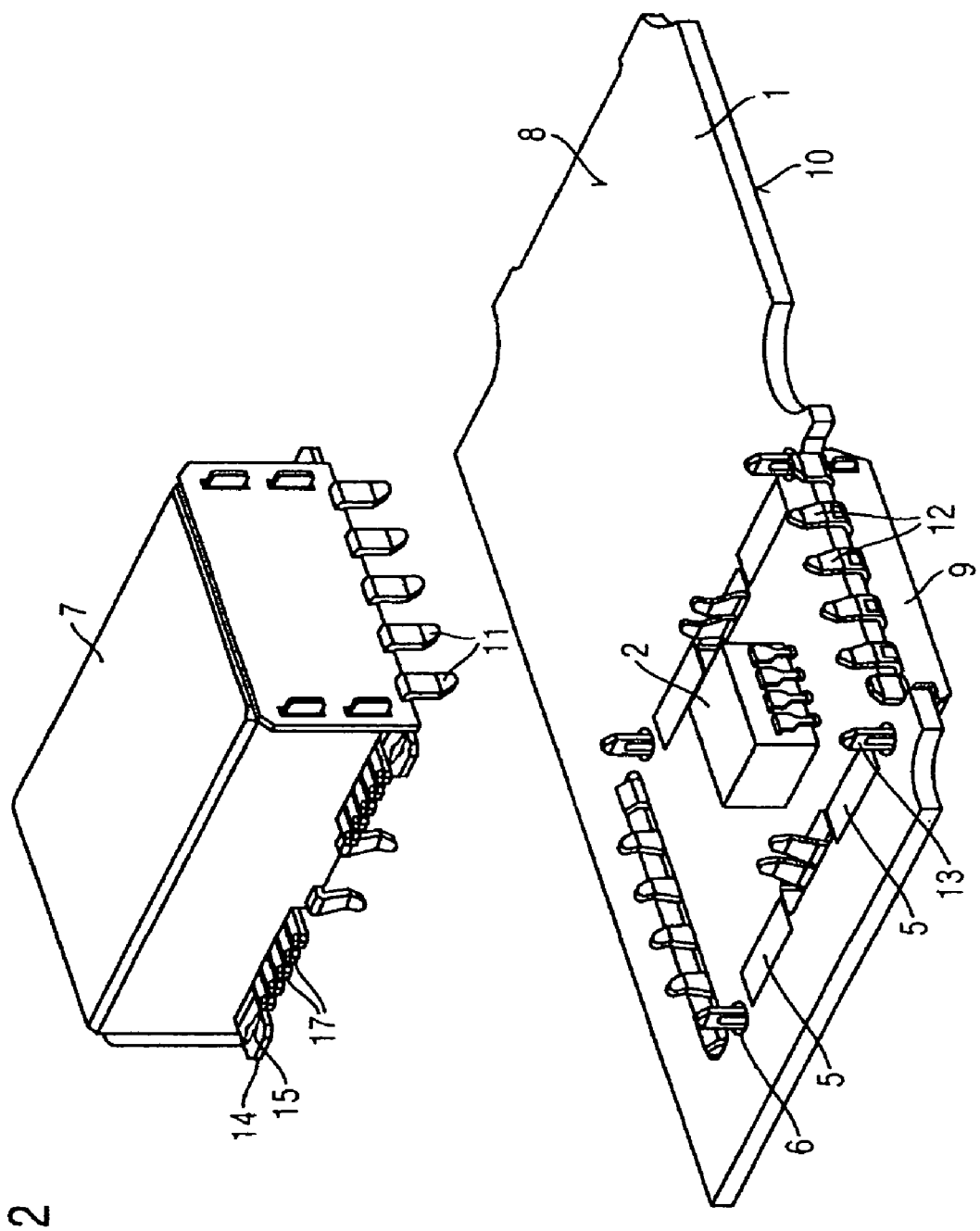
FIG. 2 shows a perspective illustration of the electrical device according to FIG. 1 with the first shielding part lifted off.

The electrical device illustrated in the figures has a carrier substrate 1 formed as a printed circuit board, on which are arranged a conductor track structure including surface conductor tracks 21 and inner conductors 21' arranged in inner conductor levels, and electronic components 2 which can be connected by the conductor track structure.

The conductor track structure and the electronic components 2 are situated within a rectangular region 3 to be shielded, which region is illustrated as enclosed by a dash-dotted line.

Along the long sides of the rectangle of the region 3 to be shielded, a continuous slot 4 is situated centrally in the carrier substrate 1, there being adjacent to said slot contact areas 5 applied to the carrier substrate 1 in strip-like fashion on both sides.

In the corner regions outside the region 3 to be shielded, adjacent to the contact area 5, first cutouts 6 are formed continuously in the carrier substrate 1.

Along the entire short sides, likewise continuous slots 4' extend in the carrier substrate 1 outside the region 3 to be shielded.

A first pot-like shielding part 7 can be placed with its opening edge region onto a first surface 8 of the carrier substrate 1 in such a way that the region 3 to be shielded is covered.

In the same way, a second pot-like shielding part 9 can be placed with its opening edge region onto a second surface 10 of the carrier substrate 1 in such a way that the region 3 to be shielded is covered from the underside.

The peripheral contours of the opening edge regions of the two shielding parts 7 and 9 are identical in this case.

The shielding parts 7 and 9 are stamped/bent parts composed of sheet-metal.

Along the short sides of the first shielding part 7, a series of first spring arms 11 directed toward the carrier substrate 1 are formed from one piece with the first shielding part 7, which are at a distance from one another corresponding to a spring arm width and protrude through the slots 4' when the first shielding part 7 is placed onto the carrier substrate.

Likewise along the short sides of the second shielding part 9, a series of second spring arms 12 directed toward the carrier substrate 1 are formed in one piece with the second shielding part 9, which are at a distance from one another corresponding to a spring arm width and protrude though the slots 4' when the second shielding part 9 is placed onto the carrier substrate 1.

Moreover, in this case the free ends of the second spring arms 12 that protrude from the slots 4' engage resiliently behind the carrier substrate 1.

By virtue of the fact that when the first shielding part 7 and second shielding part 9 are placed onto the carrier substrate 1, the first spring arms 11 and the second spring arms 12 alternately protrude through the slots 4' adjacent to one another, they mutually close the spacings between the spring arms 11 and 12, such that a continuous shielding from the first shielding part 7 to the second shielding part 9 is achieved in the region of the slots 4'.

Since, in this case, the free ends of the first spring arms 11 come to rest resiliently against a wall of the second shielding part 9 and the free ends of the second spring arms 12 come to rest resiliently against a wall of the first shielding part 7, the two shielding parts 7 and 9 are conductively connected to one another.

In the same way, first spring arms 11 and second spring arms 12 are formed on the longitudinal sides of the shielding parts 7 and 9, which spring arms protrude through the slots 4 and form a continuous shielding there.

In a manner corresponding to the first cutouts 6, sheet-metal arms 13 are formed in one piece on the second shielding part 9, which arms are directed toward the carrier substrate 1 and protrude through the first cutouts 6 when the second shielding part 9 is placed onto the carrier substrate 1.

In a manner corresponding to the first cutouts 6, on the first shielding part 7, lugs 14 bent in a manner directed away from the interior of the first shielding part 7 into a plane parallel to the plane of the carrier substrate 1 are formed in one piece with the first shielding part 7. Said lugs 14 have through openings 15 which have approximately the same cross section as the sheet-metal arms 13 and through which protrude the free ends of the sheet-metal arms 13 when the first and second shielding parts 7 and 9 are placed onto the carrier substrate 1.

Figure 3:
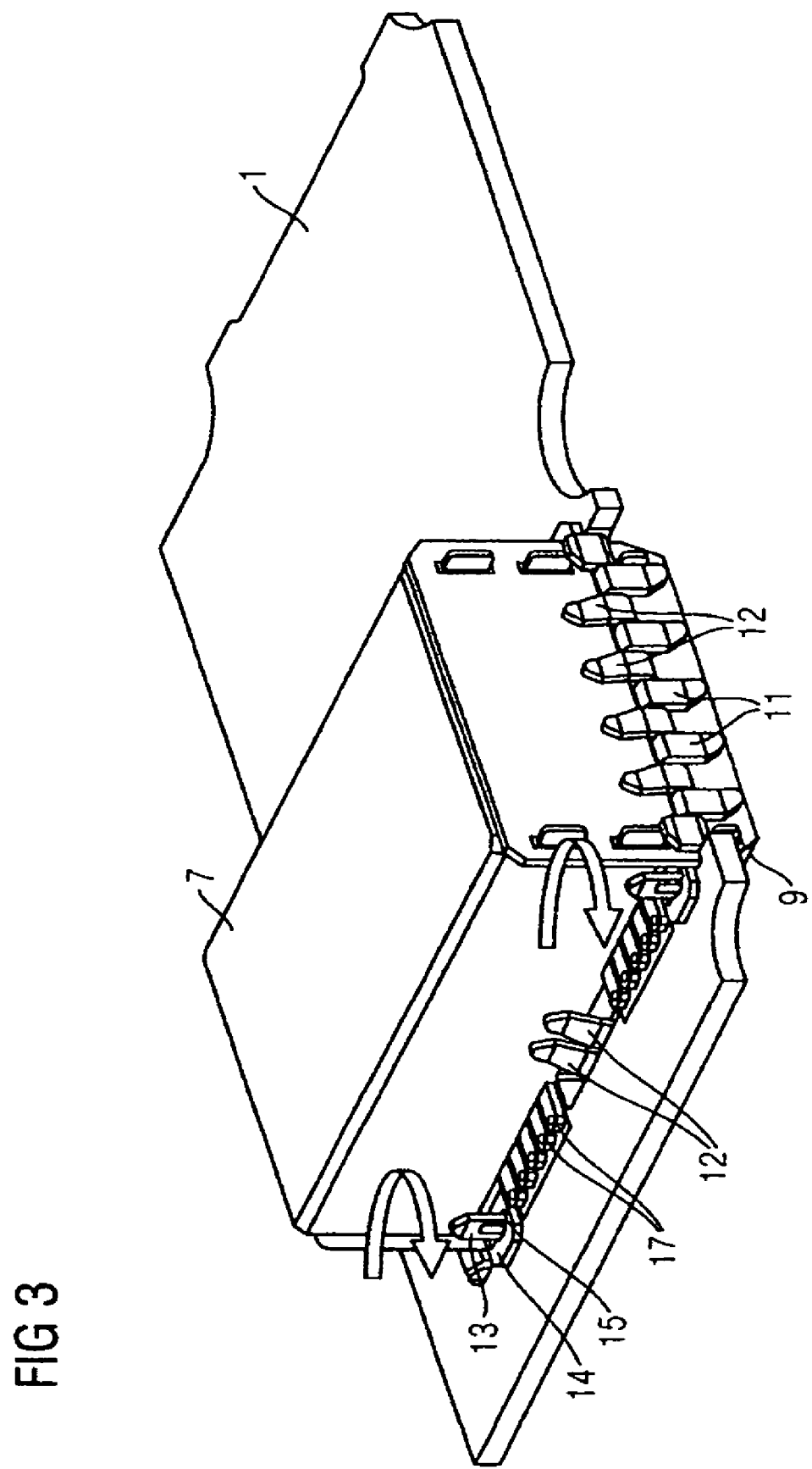
FIG. 3 shows a perspective illustration of the electrical device according to FIG. 1 in the assembled state.

By rotating the free ends of the sheet-metal arms 13 (see arrows in FIG. 3) the shielding parts 7 and 9 are secured in their installation position.

In this installation position, in the corner regions of the second shielding part 9, bearing shoulders 16 which are formed in one piece with the second shielding part 9 and are bent in a manner directed away from the interior of the second shielding part 9 likewise come to bear against the carrier substrate 1.

In the regions of the longitudinal sides of first shielding part 7 and second shielding part 9, series of contact lugs 17 are formed between the first spring arms 11 and respectively the second spring arms 12 and the lugs 14 and respectively the sheet-metal arms 13 in one piece with the first shielding part 7 and the second shielding part 9.

The contact lugs 17 extend in a plane approximately parallel to the plane of the carrier substrate 1 in a manner directed away from the interior of the first and second shielding parts 7 and 9 and bear resiliently on the contact areas 5 when the first and second shielding parts 7 and 9 are placed onto the carrier substrate 1.

Figure 4:
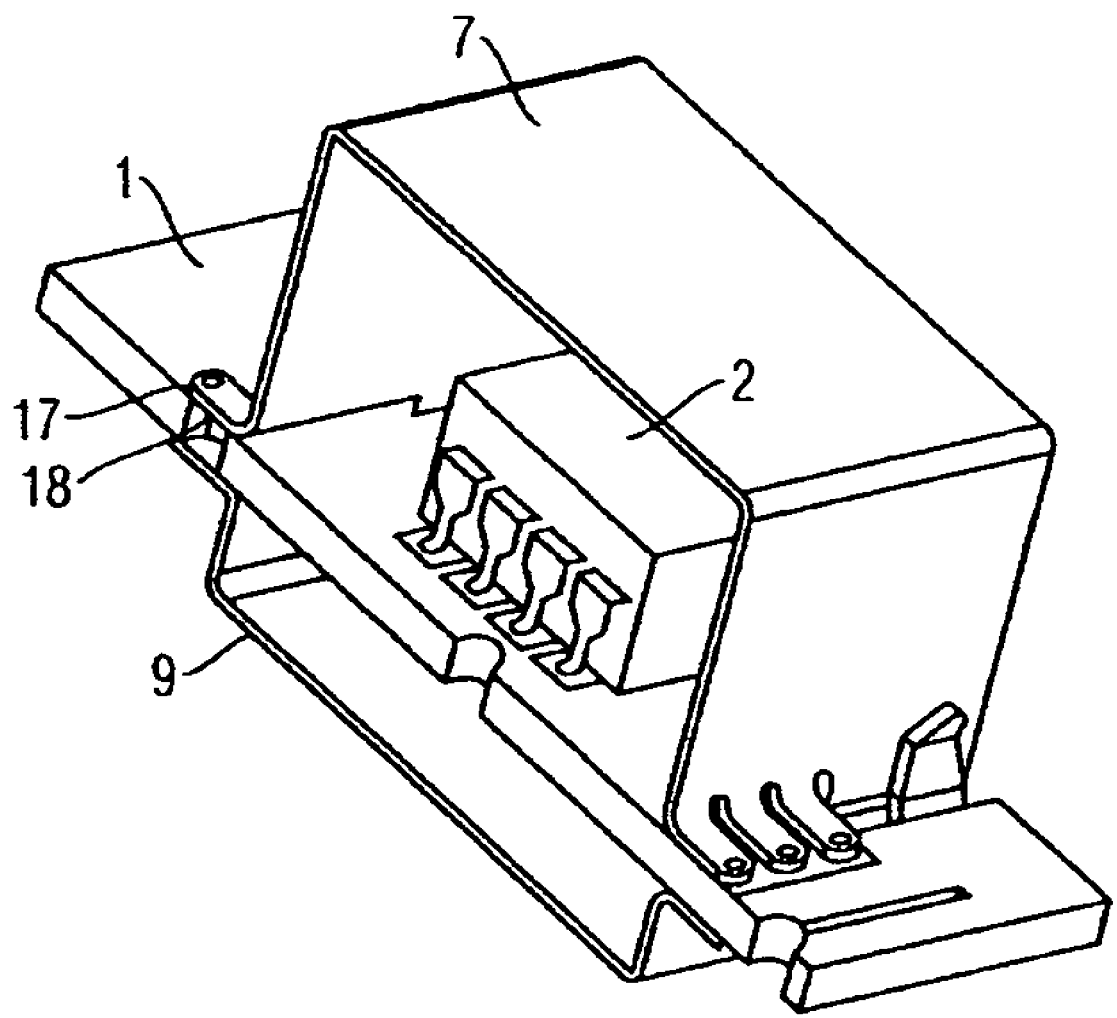
FIG. 4 shows the electrical device according to FIG. 1 in a perspective side sectional view.

The contact lugs 17 respectively lying opposite one another are electrically conductively connected to one another by means of plated-through holes 18 (see FIG. 4) arranged in the carrier substrate 1 in the region of each contact area 17.

What is claimed is:

1. An electrical device, comprising:
a carrier substrate with at least one electronic component and a conductor track structure connected to the at least one electronic component, the carrier substrate having a first surface and a second surface, a contact area on the first surface connected to fixed potential, and a first cutout and a second cutout therethrough; and
an electrically conducting shielding element enclosing the conductor track structure and the at least one electronic component, the shielding element comprising a first pot-shaped shielding part having an opening edge region on the first surface of the carrier substrate and a second pot-shaped shielding part having an opening edge region on the second surface of the carrier substrate, one of the first and second shielding parts having spring arms protruding through the second cutout and contacting the other one of the first and second shielding parts, the opening edge region of the first shielding part bearing on the contact area, the shielding element comprising fixing attachments engaging the first cutouts and fixing the first and second shielding parts to the carrier substrate.

2. The electrical device of claim 1, wherein the spring arms of the one of the first and second shielding parts have free ends that rest resiliently against the other one of the first and second shielding parts.

3. The electrical device of claim 1, wherein each of the spring arms have a width and the spring arms are arranged adjacent to one another at a distance corresponding to the spring arm width.

4. The electrical device of claim 1, wherein the second cutouts are slots through which a plurality of the spring arms protrude adjacent to one another.

5. The electrical device of claim 4, wherein the spring arms comprise first spring arms arranged on the first shielding part and second spring arms arranged on the second shielding part, the first and second spring arms protrude through the slots alternately adjacent to one another.

6. The electrical device of claim 1, wherein the fixing attachments are sheet-metal arms protruding through the first cutout and having deformable free ends.

7. The electrical device of claim 6, wherein at least one of the first shielding part and the second shielding part includes lugs on a periphery of the opening edge, the lugs being bent so that they are directed away from an interior of the one of the first and second shielding parts into a plane parallel to the plane of the carrier substrate and the lugs defining through openings through which the deformable free ends of the sheet-metal arms protrude.

8. The electrical device of claim 1, wherein at least one of the first and second shielding parts includes a plurality of bearing shoulders arranged in a manner distributed on a periphery of the opening edge, the bearing shoulders being bent in a manner directed away from the interior of the shielding element into a plane approximately parallel to the plane of the carrier substrate.

9. The electrical device of claim 1, wherein at least one of the first and second shielding parts includes on its peripheral opening edge contact lugs bent in a manner directed away from the interior of the shielding element into a plane approximately parallel to the plane of the carrier substrate and which are disposed resiliently against the contact area or contact areas on the carrier substrate.

10. The electrical device of claim 9, wherein the contact lugs are arranged in the regions between the spring arms.

11. The electrical device of claim 9, wherein the contact lugs are arranged on both of the first and second shielding parts opposite one another on the first surface and the second surface of the carrier substrate and are electrically conductively connected to one another by plated-through holes in the carrier substrate.

12. The electrical device of claim 9, wherein a plated-through hole is arranged in the region of each of the contact lugs.

13. The electrical device of claim 12, wherein the plated-through holes are arranged at a small distance from one another.

14. The electrical device of claim 9, wherein the fixing attachments are sheet-metal arms protruding through the first cutout, and wherein the contact lugs are arranged in regions between the spring arms and sheet-metal arms.

15. The electrical device of claim 1, wherein the carrier substrate is a multilayer printed circuit board.

16. The electrical device of claim 15, wherein one or two outer conductive levels of the multilayer printed circuit board form the contact areas and are connected to the fixed electrical potential.

17. The electrical device of claim 15, wherein at least one inner conductive level of the multilayer printed circuit board includes signal-carrying conductor tracks.

18. The electrical device of claim 1, wherein a plurality of conductor track structures for connecting electronic components are arranged on the carrier substrate, wherein each conductor track structure is enclosed by the electrically conductive shielding element.

19. The electrical device of claim 18, wherein the conductor track structures are conductively connected to one another via an inner conductive level of the multilayer printed circuit board.

* * * * *

UNITED STATES PATENT AND TRADEMARK OFFICE
CERTIFICATE OF CORRECTION

PATENT NO. : 7,795,543 B2 Page 1 of 1
APPLICATION NO. : 12/083382
DATED : September 14, 2010
INVENTOR(S) : Thomas Krohn It is certified that error appears in the above-identified patent and that said Letters Patent is hereby corrected as shown below:

On the title page, add the following information:

--(30) Foreign Application Priority Data

October 10, 2005    (DE)            10 2005 048 416.6--

Signed and Sealed this

Twenty-first Day of December, 2010

David J. Kappos
*Director of the United States Patent and Trademark Office*